United States Patent [19]

Gesvent

[11] Patent Number: 4,800,238
[45] Date of Patent: Jan. 24, 1989

[54] HOUSING WITH IMPROVED ADJUSTMENT ACCESS SEALING ARRANGEMENT

[75] Inventor: George Gesvent, Rock City, Ill.
[73] Assignee: Honeywell Inc., Minneapolis, Minn.
[21] Appl. No.: 118,921
[22] Filed: Nov. 10, 1987
[51] Int. Cl.⁴ .............................................. H05K 5/03
[52] U.S. Cl. ..................................... 174/52.1; 174/67; 220/344
[58] Field of Search .......................... 174/50, 52 R, 67; 220/242, 334, 344, 359

[56] References Cited
U.S. PATENT DOCUMENTS
3,621,115 11/1971 Kolster ................................... 174/67
4,180,177 12/1979 Gunderman et al. .......... 220/334 X Primary Examiner—A. T. Grimley
Assistant Examiner—David A. Tone
Attorney, Agent, or Firm—Charles L. Rubow

[57] ABSTRACT

An electronic device housing having a pivoted adjustment access sealing cover in which the cover is hinged by means of a laterally oriented pivot portion held captive in recesses cooperatively formed by the housing and a retainer. The housing and retainer are formed of the same ultrasonically weldable material and are ultrasonically welded together. The cover is formed of a material different from the material of the housing and retainer to resist ultrasonic welding and remain free for pivotal movement.

11 Claims, 1 Drawing Sheet

HOUSING WITH IMPROVED ADJUSTMENT ACCESS SEALING ARRANGEMENT

BACKGROUND OF THE INVENTION

The invention disclosed herein relates generally to reopenable access port sealing arrangements, and more particularly to housings for adjustable electronic components, the housings requiring reopenable adjustment access port seals.

It is frequently necessary to house electronic components and circuits in housings which provide protection form adverse environmental conditions. In many cases the electronic circuits and components may be capable of adjustment and adjustments may be required for set up and/or calibration purposes. In such situations, the housings must be provided with suitable adjustment, access ports to allow insertion of a screw driver or other appropriate tool. The sealing requirements for such housings are set by various standards, such as, for example, NEMA 4 which requires that no water be found within a housing after subjecting it to a prescribed water test routine. One solution for providing access ports with the sealed covers is to use a cover in the form of a screw having an 0-ring seat thereon which is inserted into a threaded access port. Such an arrangement satisfactorily meets many sealing requirements. However, it has the disadvantage that when the cover is removed it is loose and easily lost. This may result in access ports being left open, thus permitting the entry of water and other contaminants which can damage components within the housing.

The applicant has overcome this problem by providing a hinged access door of unique design which meets many access port sealing requirements. The access door is held captive to the remainder of the housing, thus preventing loss of the door, and minimizing the probability that the access port will be left open after set-up adjustment or calibration.

SUMMARY OF THE INVENTION

The present invention is a hollow housing having an access port through a wall thereof and cover means for reopenably sealing the access port. The cover is configured with a laterally oriented pivot portion supported by the housing and a retainer. The retainer and housing cooperatively define a recess configured to hold the pivot portion of the cover captive when the retainer is in place. The housing and retainer are formed of a first ultrasonically weldable material and are ultrasonically welded together. The cover is formed of a second material not suceptible of being ultrasonically welded to the first material.

DESCRIPTION OF THE PREFERRED EMBODIMEMT

For illustrative purposes, the applicant's invention is shown as designed into the head of a proximity sensor. However, an analogous arrangement is equally applicable to a variety of other sealed housings requring occasional access to internal components.

Figure 1:
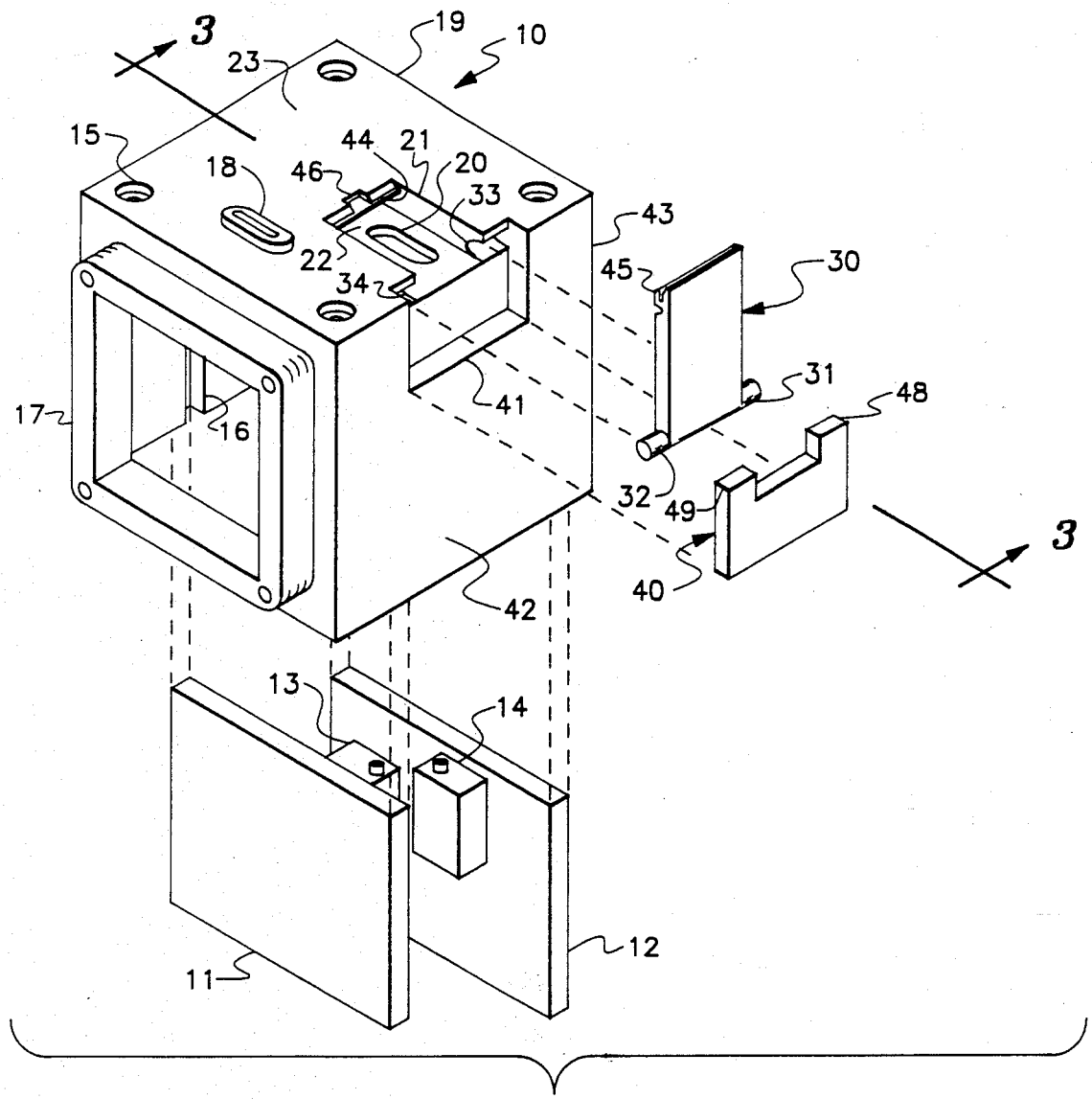
FIG. 1 is an exploded perspective view of an electronic device housing including the applicant's access port sealing arrangement.
Figure 2:
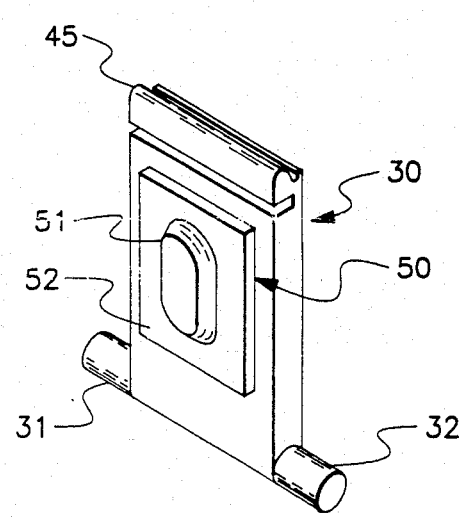
FIG. 2 is a perspective view of the side of the cover and gasket opposite that shown in FIG. 1.
Figure 3:
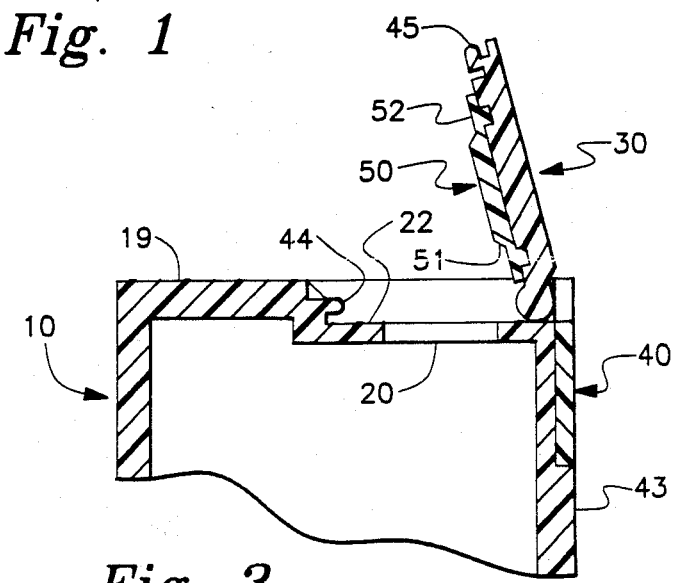
FIG. 3 is a partial sectional view of the assembled housing taken along lines 3—3 in FIG. 1.

In FIG. 1, reference numeral 10 generally identifies a housing of a head portion of a proximity sensor. Housing 10 houses and protects a transmitting and receiving transducer and transmitter/receiver electronics. Housing 10 may also house optional electronics such as timing and/or counting circuits. The electronics are mounted on printed circuit boards such as identified by reference numerals 11 and 12. Certain adjustable components may be mounted on the printed circuit boards. Reference numerals 13 and 14 identify potentiometers which may be adjusted by turning slotted screw heads thereon.

As shown, housing 10 is designed to be mounted on a body (not shown) having the configuration of a standard heavy duty limit switch. Head 10 may be mounted on the body by means of screws not shown extending through countersunk holes, of which one is identified by reference numeral 15. Printed circuit boards 11 and 12 are mounted in internal slots in housing 10, such as identified by reference numeral 16. Housing 10 is shown with a mounting bezel 17 for accommodating an optical lens (not shown).

Housing 10 is also provided with an optical port 18 for viewing suitable indicators, such as light emitting diodes, for indicating the presence or absence of a signal. In the arrangement shown, the diodes may be mounted on printed circuit board 11.

With printed circuit boards 11 and 12 in place in housing 10, the adjustment screws on potentiometers 13 and 14 are aligned with an adjustment access port 20 in a first wall 19 of the housing. The access port is located at the bottom of a depression 21 in the first wall of the housing. The depression is shown with a generally planar bottom surface 22 parallel with the outer surface 23 of the first wall of the housing.

Reference numeral 30 identifies an access cover configured to be recessed within depression 21. Cover 30 is formed with a laterally oriented pivot portion comprising laterally extending protrusions 31 and 32. When cover 30 is in place, protrusions 31 and 32 are positioned within recesses 33 and 34 in the edge of first housing wall 19.

The cover is held captive by a retainer 40 configured to fit within a depression 41 in outer surface 42 of a second wall 43 of housing 10. Walls 19 and 43 are adjacent and outer surfaces 23 and 42 respectively thereof are joined at a corner. Retainer 40 is formed of the same material as housing 10, the material being chosen to permit ultrasonic welding of the two parts. Cover 30 is molded of a material different from the material of the housing and retainer. Thus, it does not adhere to the housing or retainer during the ultrasonic welding process, and is free to pivot after the process is complete.

Retainer 40 includes portions 48 and 49 which cover the openings of depressions 33 and 34 facing second wall 43. Thus, cover 30 is held captive to housing 10.

Wall 19 of housing 10 is molded with a lip 44 at a location separated from recesses 33 and 34. Cover 30 is molded with a complementary resilient lip 45 which snaps over lip 44 as cover 30 is pressed closed. Reference numeral 46 identifies a slot for inserting a screwdriver or other suitable tool for prying the cover open.

Cover 30 is fitted with a resilient gasket 50 having a protruding portion 51 with the same general size and shape as opening 20. However, protrusion 51 is tapered so that as cover 30 is closed, a first seal is formed between the protrusion and the edge of opening 20. Gasket 50 is also formed with a generally planar surface 52 surrounding protruding portion 51. As cover 30 is closed, planar portion 52 contacts the bottom surface 22 of depression 21 to form a second seal surrounding opening 20. This double seal has been found to be particularly reliable, and to meet most relevant sealing standards.

Although a particular embodiment of the applicant's adjustment access sealing arrangement for electronic device housings is shown and described for illustrative purposes, a number of variations and modifications will be apparent to those familiar with the relevant arts. It is intended that coverage of the invention not be limited to the embodiment shown, but only by the terms of the following claims.

The embodiments of the invention in which an exclusive property or right is claimed are defined as follows:

1. In a device of the type including a hollow housing having an access port through a first wall of the housing and cover means for reopenably sealing the access port, the improvement which comprises:
   a cover having a laterally oriented pivot portion supported by said housing: and
   a retainer, said retainer and said housing cooperatively defining a recess configured to hold the pivot portion of said cover captive when said retainer is in place, said housing and said retainer being formed of a first ultrasonically weldable material and being ultrasonically welded together, the cover being formed of a second material not susceptible of being ultrasonically welded to the first material, said housing and said cover being provided with means for releasably holding said cover in a position to seal the access port.

2. The device of claim 1 wherein:
   said housing is generally configured as a rectangular polyhedron of which a first exterior surface comprises a surface of the first wall of the housing having the access port therethrough and a second adjacent exterior surface comprises an exterior surface of a second wall which intersects the first wall;
   the recess configured to hold the pivot portion of said cover is defined by oppositely extending depressions in the edge of the first wall, each depression having an open portion opening toward the second wall; and
   the retainer is configured and positioned to close the portions of the oppositely extending depressions opening toward the second wall.

3. The device of claim 2 wherein said means for releasably holding said cover in a position to seal the access port comprises:
   a lip formed in the first wall of said housing remote from the recess holding the pivot portion of said cover; and
   a mating lip formed on said cover configured and positioned to snap over the lip in the first wall of said housing as said cover is moved to a position to seal the access port.

4. The device of claim 3 further including a sealing gasket mounted on said cover for facilitating sealing of the access port.

5. The device of claim 4 wherein:
   the first wall of said housing is formed with a depression surrounding the access port, the depression having a planar bottom surface; and
   said gasket is formed with a tapered projection thereon configured to extend partially into the access port and provide a first seal around the edge thereof, said gasket further being formed with a planar surface surrounding the projection and configured to contact the planar bottom surface of the depression in the first wall to form a second seal.

6. A housing with means for reopenably sealing an access port therein, comprising:
   a housing member molded of a first ultrasonically weldable material, said housing member having a cavity therein and having first and second adjacent walls, each with an outer surface joined along an edge thereof to form a corner, the first wall having an opening therein providing access to the cavity, the opening being located in a depression in the outer surface of the first wall extending toward the outer surface of the second wall, the edge of the first wall adjacent the second wall having oppositely extending recesses therein opening toward the outer surface of the second wall;
   a cover having a first portion configured to fit within the depression in the outer surface of the first wall of said housing member and seal the opening through the first wall, and a laterally oriented pivot portion located in the recesses in the edge of the first wall; and
   a retainer molded of the first ultrasonically weldable material, said retainer being configured to hold the pivot portion of said cover captive in the recesses in the edge of the first wall of said housing member, said retainer being ultrasonically welded to said housing member to hold the pivot portion of said cover captive.

7. The housing of claim 6 wherein said housing member contains electronic circuitry having adjustable means positioned to be reached through the opening in the first wall.

8. The housing of claim 7 wherein said housing member contains an ultrasonic distance sensor transducer and transmitter and receiver electronics for said transducer.

9. The housing of claim 8 further including a gasket on said cover for facilitating sealing of the opening in the first wall of said housing member.

10. The housing of claim 9 wherein:
    the depression in the outer surface of the first wall of said housing member has a generally planar bottom surface surrounding the opening in the first wall; and
    said gasket is configured with a planar portion adapted to contact the planar bottom surface of the depression in the outer surface of the first wall of said housing member to form a first seal, said gasket further being configured with a tapered protrusion adapted to extend into the opening in the first wall to form a second seal around the edge of the opening.

11. The housing of claim 10 wherein the first wall of said housing member is formed with a first lip remote from the recesses holding the pivot portion of said cover; and
    said cover is formed with a second lip configured to releasably engage the first lip to retain said cover in a sealing relationship with the opening in the first wall.

* * * * *